(12) United States Patent
Meyers et al.

(10) Patent No.: US 6,680,632 B1
(45) Date of Patent: Jan. 20, 2004

(54) METHOD/ARCHITECTURE FOR A LOW GAIN PLL WITH WIDE FREQUENCY RANGE

(75) Inventors: Steven Meyers, Round Rock, TX (US); Nathan Y. Moyal, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/083,442

(22) Filed: Feb. 26, 2002

(51) Int. Cl.[7] .................................................. H03L 7/06
(52) U.S. Cl. ........................................ 327/155; 327/156
(58) Field of Search ................................ 327/155, 156, 327/157, 147, 148, 146; 331/17, 25, 34, 187, DIG. 2, 179, 180; 375/294, 375, 376

(56) References Cited

U.S. PATENT DOCUMENTS 5,854,575 A * 12/1998 Fiedler et al. ................. 331/10
5,949,289 A * 9/1999 Smith et al. .................... 331/8
6,462,623 B1 * 10/2002 Horan et al. ................... 331/17

OTHER PUBLICATIONS

"A 6–GHz Integrated Phase–Locked Loop Using AlGaAs/GaAs Heterojunction Bipolar Transistors", By Aaron W. Buchwald et al., IEEE Journal of Solid–State Circuits, vol. 27, No. 12, Dec. 1992, pp. 1752–1762.

* cited by examiner

Primary Examiner—Timothy P. Callahan
Assistant Examiner—Linh Nguyen
(74) Attorney, Agent, or Firm—Christopher P. Maiorana, P.C.

(57) ABSTRACT

An apparatus comprising a voltage controlled oscillator (VCO) within a phase lock loop (PLL) that may be configured to generate an output signal in response to (i) a low gain control input and (ii) a high gain control input. The low gain control input and the high gain control input are generally both active.

20 Claims, 4 Drawing Sheets

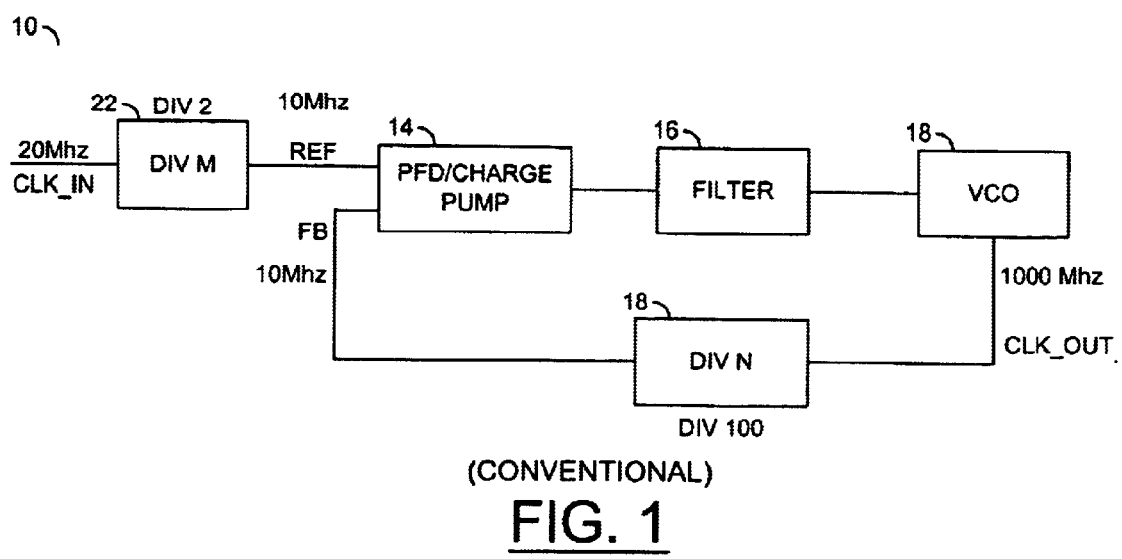
(CONVENTIONAL)
FIG. 1
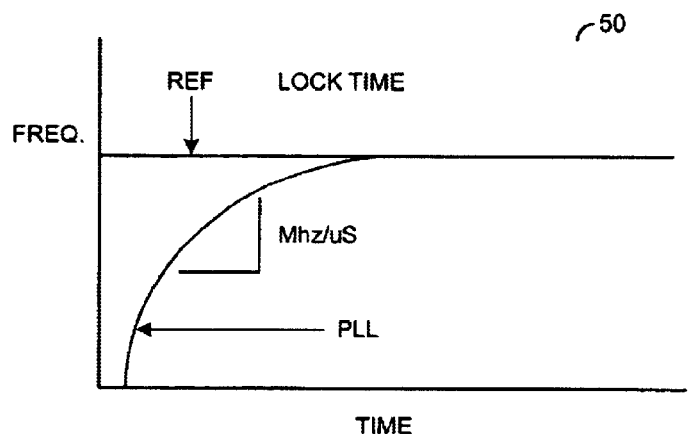
(CONVENTIONAL)
FIG. 2

METHOD/ARCHITECTURE FOR A LOW GAIN PLL WITH WIDE FREQUENCY RANGE

FIELD OF THE INVENTION

The present invention relates to a method and/or architecture for implementing a phase lock loop (PLL) generally and, more particularly, to a method and/or architecture for implementing a wide frequency range PLL without suffering from noise sensitivities inherent in typical high gain PLL systems.

BACKGROUND OF THE INVENTION

PLLs are often implemented as clock multipliers. For example, an input clock frequency of 20 Mhz can be multiplied by a PLL to yield an output frequency of 1000 Mhz. Ideally, the clock multiplication would result in an output clock that is in perfect phase alignment with the input clock.

Referring to FIG. 1, a conventional PLL architecture 10 is shown. The PLL 10 includes a phase frequency detector (PFD)/charge pump 14, a filter 16, a voltage controlled oscillator (VCO) 18, a divider 20, and a divider 22. The PFD section of the circuit 14 presents charge pump section signals in response to the frequency and phase of the reference signal REF relative to the feedback clock FB. The charge pump section of the circuit 14 pumps up or down in response to the frequency and presents a signal to the filter 16. The filter 16 integrates the filter signal into a voltage. The VCO 18 converts the voltage signal into the clock signal CLK_OUT. The divider 20 divides down the higher speed frequency (i.e., 1000 MHZ) of the signal CLK_OUT for comparison by the PFD/charge pump 14 at 10 MHZ. A divider 22 divides the input frequency (i.e., 20 MHZ) of the signal CLK_IN before being presented to the PFD/charge pump 14 as the reference frequency (i.e, 10 MHZ) REF.

Referring to FIG. 2, a timing diagram 50 illustrating PLL lock time versus frequency is shown. The lock time of a PLL is greater as the operating frequency of the PLL is increased.

There are several conventional approaches for obtaining wide frequency range in a PLL. In one approach, the VCO must inherently have large gain (MHZ/V) to cover the operating frequency range over process variations. Such high gains VCOs are inherently sensitive to noise. For example, low frequency input noise on filter nodes is multiplied by the gain resulting in unwanted frequencies (jitter). Jitter is undesirable in PLLs, in particular to PLLs in SONET applications.

Another conventional approach for obtaining a wide frequency range in a VCO is described in "A 6-Ghz Integrated Phase-Locked Loop Using AlGaAs/GaAs Heterojunction Bipolar Transistor—IEEE, Journal of solid-state Circuits, vol. SC-27, pp. 1752–1762, December 1992". The article shows fine and coarse control on the VCO. The PLL operates in either a high gain (MHZ/V) or a low gain mode. The high gain mode will typically result in faster lock time and wide frequency range, but at the expense of increasing jitter. Once such a system is close to locking, the system switches to the lower VCO gain, therefore achieving fast lock time without sacrificing jitter.

However, such an approach requires a logic decision to inform the system when to switch from coarse control mode to fine control mode. Such logic complicates the PLL design. Also, once the PLL is in fine mode, the coarse mode has to be disabled. Disabling the coarse mode without losing PLL lock or generating noise can be difficult to implement. The range of the VCO in the fine mode must be wide enough to keep the PLL locked over operating temperature without activating the coarse mode.

It would be desirable to implement a noise resistant PLL that has a wide frequency range, but does not suffer from using additional logic and/or other adaptive systems to control the PLL during startup.

SUMMARY OF THE INVENTION

The present invention concerns an apparatus comprising a voltage controlled oscillator (VCO) within a phase lock loop (PLL) that may be configured to generate an output signal in response to (i) a low gain control input and (ii) a high gain control input. The low gain control input and the high gain control input are generally both active.

The objects, features and advantages of the present invention include providing a method and/or architecture for a wide frequency range PLL that may be implemented (i) without suffering from the noise sensitivities inherent in the high gain PLL system (ii) with an op-amp in the high gain path, (iii) with an op-amp and low pass filter in the high gain loop, (iv) with the integration of the main filter with a high gain path filter (e.g., without separate filters), (v) via high and low gain architectures which are always on (e.g., instead of being switched in/out), (vi) via high and low gain architectures which are self-adaptive (e.g., without decision logic), (vii) with a reference to set up the desired filter node, (viii) with a filter node to drive the buffer in the high gain path and/or (ix) with an internal filter node to drive the buffer in the high gain path.

BRIEF DESCRIPTION OF THE DRAWINGS

These and other objects, features and advantages of the present invention will be apparent from the following detailed description and the appended claims and drawings in which:

FIG. 1 is a block diagram of a conventional phase lock loop architecture;

FIG. 2 is a timing diagram of the circuit of FIG. 1;

DETAILED DESCRIPTION OF THE PREFERRED EMBODIMENTS

Figure 3:
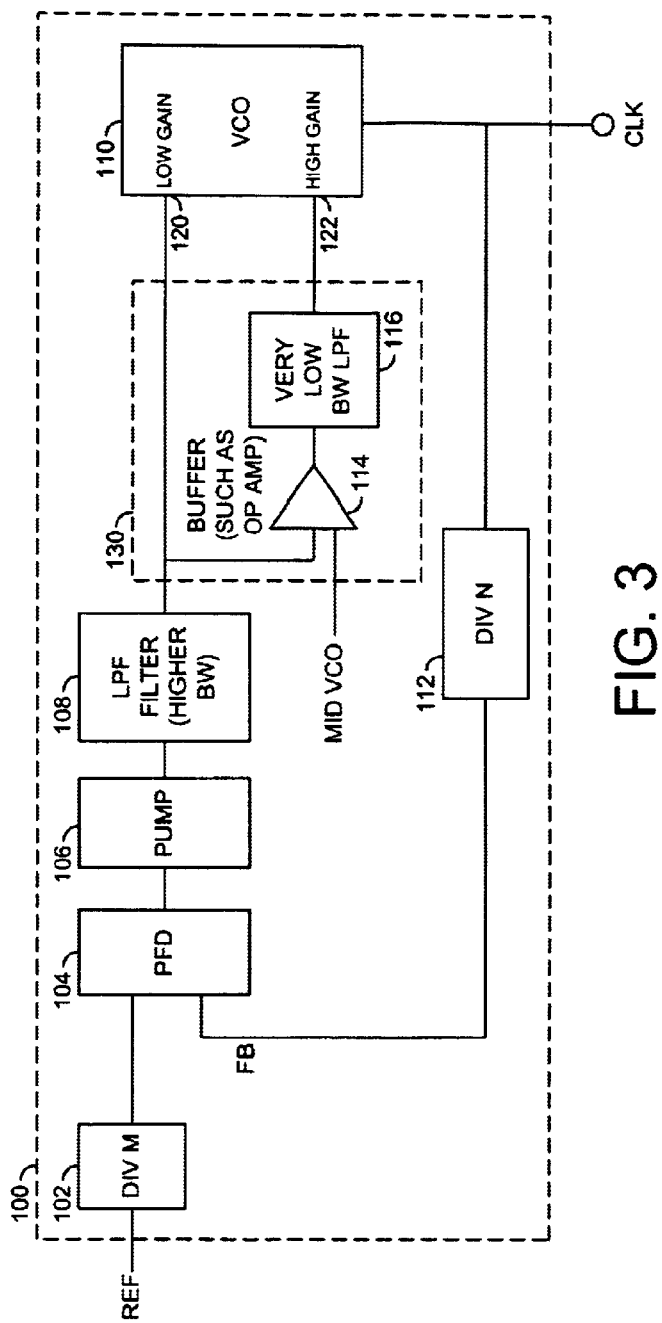
FIG. 3 is a block diagram of a preferred embodiment of the present invention.

Referring to FIG. 3, a block diagram of a circuit 100 is shown in accordance with a preferred embodiment of the present invention. The circuit 100 may be implemented as a wide frequency range Phase Lock Loop (PLL) without the implementation of conventional high gain PLL techniques or other conventional adaptive means. For example, the present invention may be implemented without a high gain VCO (large MHZ/V). A high gain VCO may be sensitive to noise and normal filter voltage ripples. The circuit 100 may implement a PLL with a wide frequency range without suffering from the noise sensitivities inherent in conventional high gain PLL systems.

The circuit 100 generally comprises a divide block (or circuit) 102, a phase frequency detector (PFD) block (or circuit) 104, a pump block (or circuit) 106, a low pass filter (LPF) block (or circuit) 108, a voltage control oscillator (VCO) block (or circuit) 110, a divider block (or circuit) 112, an amplifier (or buffer) block (or circuit) 114 and a filter block (or circuit) 116. The circuit 102 may have an input that may receive a reference clock signal (e.g., REF). The circuit 110 may have a low gain control input 120 that may receive a signal (e.g., LOW_IN) from the LPF 108, a high gain control input 122 that may receive a signal from the amplifier 114, and an output that may present a signal (e.g., CLK). The filter 116 may also be connected to the input 122. The filter 116 may be implemented as a very low bandwidth low pass filter. The amplifier 114 and the filter 116 may implement a control block (or circuit) 130. The signal CLK may be implemented as a clock signal or another type signal having a frequency.

The circuit 114 may be configured to present the signal to the input 122 in response to the signal LOW_IN and an external input signal (e.g., MID_VCO). In one example, the signal MID_VCO may be implemented as a frequency range reference signal (e.g., a voltage reference) that corresponds to approximately the mid-frequency operating range of the VCO 110. However, the signal MID_VCO may be implemented as any appropriate signal type (e.g., a current signal, a digital signal, etc.) and/or frequency range accordingly to meet the design criteria of a particular application.

The circuit 100 may be configured to operate in both a high gain mode (e.g., via a path to the input 122) and a low gain mode (e.g., via a path to the input 120). The circuit 100 may engage both the high gain and low gain modes at the same time (e.g., no external switching is needed). During a locking phase, both the high gain and low gain modes may be engaged. The low gain path may be implemented having a wider bandwidth and may be configured to adapt faster than the low bandwidth (high gain) path. If the low gain path is low enough, the main filter (e.g., input 120) may reach a maximum operating point and will clamp. Such clamping is generally configured to leave on the low gain path, avoiding the implementation of additional switching circuitry.

Meanwhile, the high gain path (e.g., input 122) may be configured to slowly adjust until the PLL 100 operates in a frequency range close to locking. Once the PLL 100 is close to locking, the low gain path (e.g., input 120) generally operates at an optimal operating point (e.g., not clamped any longer) and is generally configured to contribute to the locking. Once in lock, the filter 116 may be configured to supply a biasing voltage (or current) to the VCO 110 therefore setting the nominal operating point of the circuit 100. The filtering that follows the amplifier 114 (e.g., the filter 116) may be configured to ensure that the VCO 110 biasing is well filtered against noise. Meanwhile, the low gain path generally maintains the PLL lock and adjusts for filter leakage and internal noise (e.g., operates normally). The low gain path generally has a wider bandwidth than the high gain path and is generally able to reject a wider range of noise over a particular frequency range. In other words, once the final operating frequency is achieved, the low gain input 120 will dominate the response of the PLL 100 by reacting to small correctional pulses (e.g., a higher bandwidth loop), while the high gain input 122 generally sets the frequency range. However, the circuit 100 is generally configured to operate the low gain path and the high gain path simultaneously (e.g., continuously).

The amount of noise rejection provided by the circuit 100 generally depends on (i) the difference in band-widths between the low gain and high gain path, (ii) the difference in gain between the two paths, and/or (iii) the order of the low pass filter in the high gain path (the order of the filter in the low gain path is generally 1). A typical PLL may have an open loop response as follows:

$$Gpll = Kpd \cdot \left(Rlowgain + \frac{1}{S \cdot Clowgain}\right) \cdot \frac{Kvco}{S}$$

A PLL implementing the operational amplifier 114 and the first order RC filter 116 as described may have an open loop response as follows:

$$Gpll = Kpd \cdot \left(Rlg + \frac{1}{S + Clg}\right) \cdot$$
$$\left[\left(\frac{Kvcolg}{S}\right) + \frac{1}{(Rhg \cdot Chg \cdot S + 1)} \cdot Kopamp \cdot \frac{Kvcohg}{S}\right]$$

As Rhg*Chg >> Rlg*Clg, the second term in the equation goes to zero and the equation reverts back to the typical PLL open loop response. The circuit 100 generally reduces noise by the following factor:

$$\frac{Kvco\_hg}{Kvco\_lg} \cdot \left(\frac{Pole\_hg}{Pole\_lg}\right)^{Pole\_hg\_order}$$

When Pole_hg << Pole_lg
  Where:
    Kvco_lg is the gain of the low gain input to the VCO,
    Kvco_hg is the gain of the high gain input to the VCO,
    Pole_hg is the −3 DB frequency of the high gain loop,
    Pole_lg is the −3 DB frequency of the low gain loop, and
    Pole_hg_order is the low pass filter order of the high gain loop.
  The noise of the PLL may be increased by the amount of:

$$Kbuffer \cdot \left(\frac{Pole\_hg}{Pole\_lg}\right)^{Pole\_hg\_order}$$

Where:
  Kbuffer is the effective close loop gain of the OP-AMP or buffer.

During startup the output frequency is generally far off from the desired locked frequency. During startup, the low gain loop does not generally have the range to move the VCO 110 to the locked frequency. The low gain loop either rails out to a control voltage that is in the right direction or during, cycle slip, slews the output control voltage LOW_IN toward the correct direction. In either case, the control voltage LOW_IN will be moving in the correct direction. The high gain loop generally adds to the effect of the control voltage LOW_IN. In particular, the high gain loop generally forces the output voltage to respond to the VCO high gain input so that the VCO 110 moves towards the desired locked frequency. This moves the output voltage of the low gain path towards a mid value (through normal PLL operation). Eventually the high gain loop moves the output frequency of the VCO 110 close enough to the locked frequency to be within range of the low gain loop. At this point the low gain loop will adjust the output of the VCO 110 faster than the high gain loop. The PLL will operate at the locked frequency. The high gain loop will continue to function and will eventually adjust the low gain control voltage LOW_IN to a mid-point. The high gain loop is generally functional and does not clamp.

Another condition that may cause a need to re-acquire lock may occur if the reference signal REF and the signal FB were pulled beyond the hold range of the circuit 100. In such a case, the circuit 100 may cycle through another PLL acquire phase which is generally similar to the power up (startup) acquire phase. The hold range of a PLL is generally defined as the maximum off-set between the reference signal REF and the signal FB that does not cause the PLL to lose frequency lock. The PLL 100 generally adjusts to the correct frequency without a cycle slip. If a PLL 100 has a possibility of cycle slipping in order to acquire a lock condition, then the PLL 100 may be considered in the acquire phase of operation (similar to during power-up).

Figure 4:
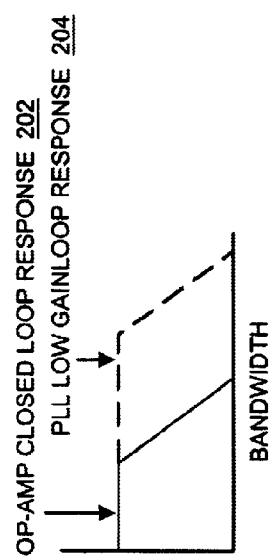
FIG. 4 is a bandwidth diagram illustrating an operation of the present invention.

Referring to FIG. 4, a bandwidth diagram 200 illustrating loop bandwidth of the present invention is shown. A trace 202 may correspond to the high gain (e.g., the input 122) path bandwidth. A trace 204 may correspond to the low gain (e.g., the input 120) path bandwidth. The low gain path (loop) is generally implemented with a higher bandwidth (e.g., the bandwidth 204) than the bandwidth that is implemented in the high gain path (loop) (e.g., the bandwidth 202).

Figure 5:
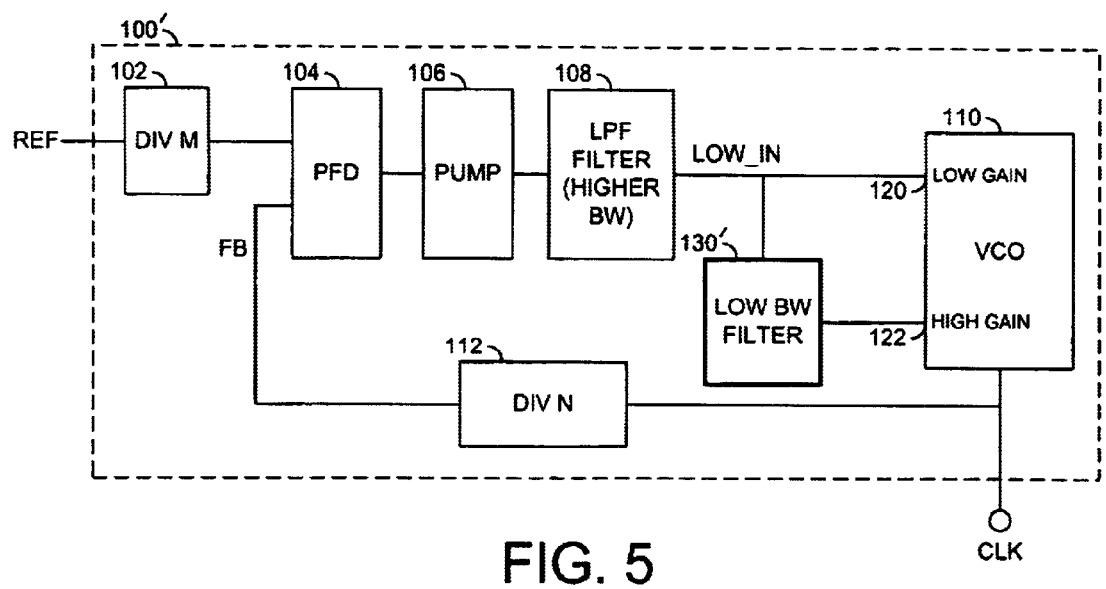
FIG. 5 is a block diagram of an alternate embodiment of the present invention.

Referring to FIG. 5, an alternate circuit 100' is shown implementing an alternate control block 130'. The circuit 100' may be implemented similarly to the circuit 100. The block 130' may be implemented (i) as a low bandwidth filter and (ii) without the external range signal MID_VCO illustrated in FIG. 3. The circuit 130' may be configured to generate the high gain and the low gain inputs in response to an output of the charge pump circuit 106. The low bandwidth filter 130' may be implemented as any appropriate filter accordingly to meet the design criteria of a particular implementation.

Figure 6:
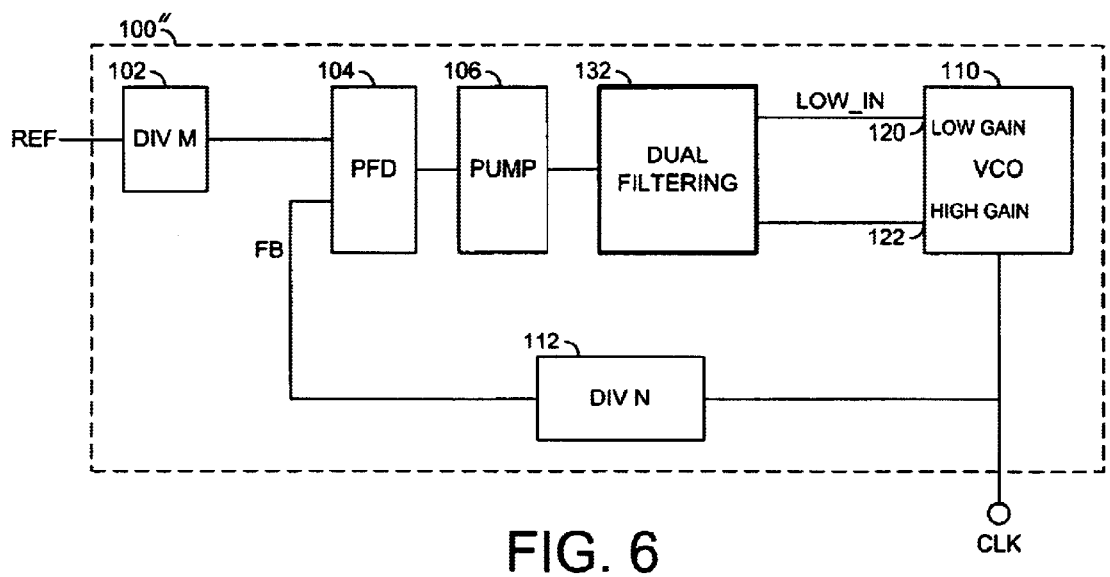
FIG. 6 is a block diagram of an alternate embodiment of the present invention.

Referring to FIG. 6, an alternate circuit 100" is shown implementing a block 132 as a combination of the low pass filter 108 (of FIGS. 3 and 5) and the control block 130' (of FIG. 5). The circuit 100" may be implemented similarly to the circuit 100. In one example, the block 132 may be a dual filter. In another example (not shown) a number of "N" op-amps (similar to the circuit 114) and "N" filters (similar to the circuit 116) may be implemented in the high VCO gain path in the circuit (or block) 132, where N is an integer. Such multiple amplifiers (or buffers) and filters generally enhance locking. Wide bandwidth filtering may be implemented when the circuit 100" is subject to operating outside a desired lock range. In another example, differential structures (e.g., one or more differential filters) may be implemented in the circuit 132. The signals presented to the low gain input 120 and the high gain input 122 to the VCO 110 may be selected from respective internal filter nodes of the N-node filter 132.

Figure 7:
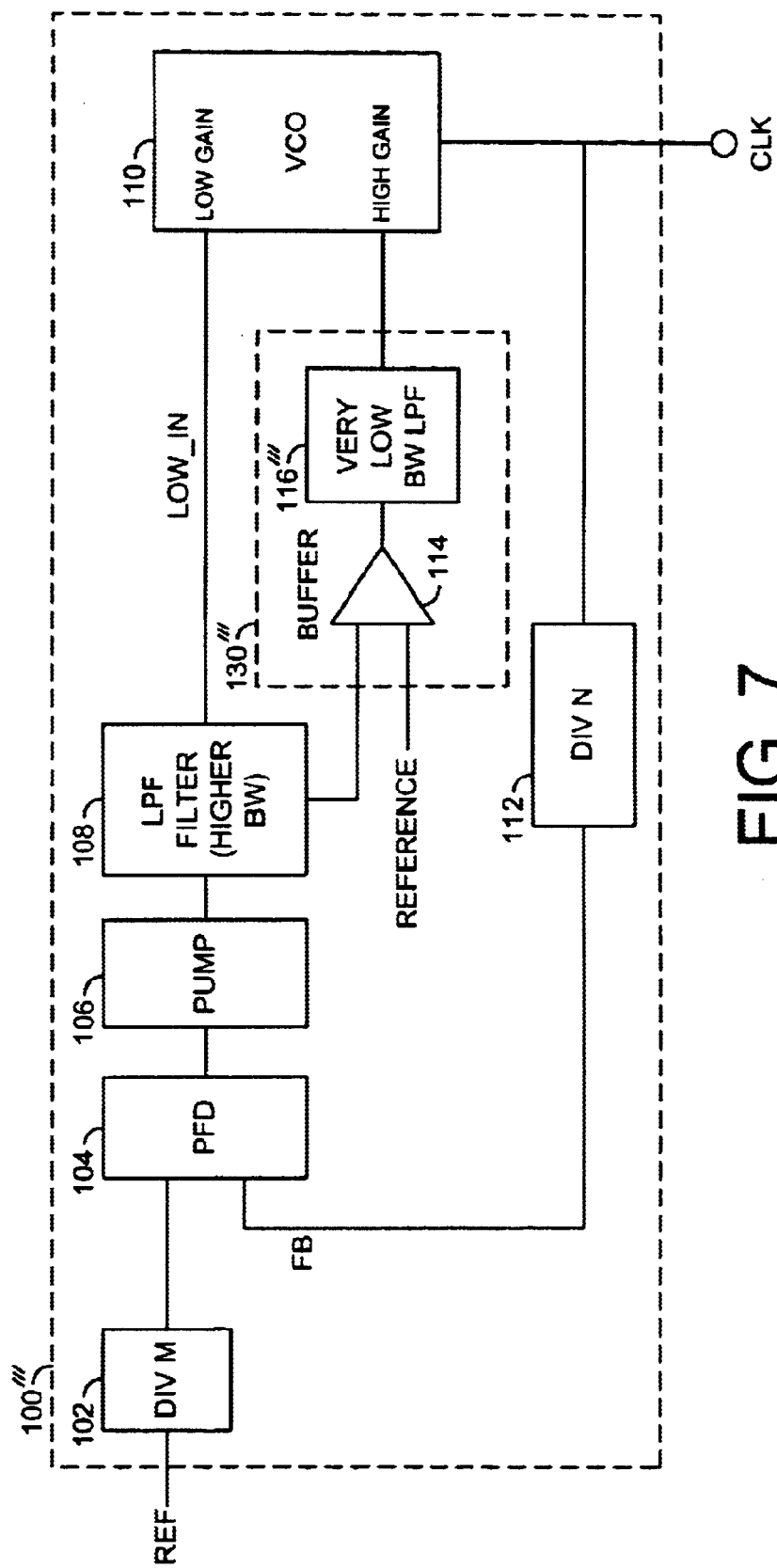
FIG. 7 is a block diagram of an alternate embodiment of the present invention.

Referring to FIG. 7, a circuit 100''' illustrating another alternate embodiment in accordance with the present invention is shown. The circuit 100''' may be implemented similarly to the circuit 100. The circuit 100''' may comprise a circuit 130'''. The circuit 130''' may be implemented similarly to the circuit 130.

The circuit 130''' generally comprises the circuit 114 and a circuit 116'''. The circuit 114 may be configured to receive alternative input signals than the input signals LOW_IN and MID_VCO. The circuit 114 may receive an input signal from an internal node of the LPF circuit 108 that is a lower bandwidth (e.g., a very low bandwidth) signal than the signal LOW_IN. The circuit 114 may also receive an external reference signal (e.g., REFERENCE). In one example, the signal REFERENCE may be implemented as the signal REF. However, the signal REFERENCE may be implemented as any appropriate signal accordingly to meet the design criteria of a particular application.

The circuit 116''' may be implemented similarly to the circuit 116. The circuit 116''' may be implemented as a very low bandwidth low pass filter. The circuit 116''' may be configured to further enhance the noise insensitivity characteristics of the present invention.

A typical noise characteristic may be provided by the following example where

Kvco_lg=10 MHz/Volt
Pole_lg=1 MHz
Kvco_hg=100 MHz/Volt
Pole_hg=50 KHz
Pole_hg_order=2
Kbuf=1

In such an example, the noise at the output of the VCO 110 would be 2.5% of a typical PLL where a typical PLL would use the Kvco_hg gain and the Pole_lg bandwidth. An addition factor of 0.25% may be added due to the noise being amplified at the high gain input of the VCO. The total noise out of the VCO will be 2.75% of a typical PLL.

The circuit 100 generally solves the design issue of PLL bandwidth versus jitter by implementing the best features of both factors. The circuit 100 offers wide frequency range without having to suffer from high VCO gain (e.g., noise sensitivity). The circuit 100 does not require decision logic as discussed in the background section to determine when to switch between fine and coarse modes. The circuit 100 does not restrict the range of the fine mode.

The present invention may provide a method and/or architecture for implementing a wide frequency range PLL without suffering from the noise sensitivities inherent in the conventional high gain PLL system. The present invention may implement an op-amp and low pass filter in a high gain path. The amplifier 114 and the low pass filter 116 may be implemented in the high gain path to the input 122. However, the main filter 108 and the "high gain path" filter (e.g., the block 130) may be integrated (the present invention may be implemented without separate filters). The present invention may implement high and low gain architectures which are always on (instead of switched in/out as in some conventional PLL circuitry). The present invention may implement high and low gain architectures that may be configured as self-adaptive circuits (e.g., no decision logic is implemented). The present invention may implement a reference signal to set up the desired filter node. In one example, present invention may implement a separate filter node to drive the buffer 114 in the high gain path. In another example, the present invention may implement an internal (e.g., integrated) filter node to drive the buffer 114 in the high gain path.

The present invention may be particularly useful in the SONET market via implementation of PLL architecture to capture a wide frequency range without suffering from the high noise sensitivity typical in conventional wide frequency PLLs.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a voltage controlled oscillator (VCO) within a phase lock loop (PLL) configured to generate an output signal in response to (i) a low gain control input and (ii) a high gain control input, wherein (i) said low gain control input and said high gain control input are both active and (ii) a filter circuit that is configured to clamp said low gain control input in response to reaching a maximum operating point prior to said PLL acquiring a lock.

2. The apparatus according to claim 1, wherein said PLL further responds to an input signal.

3. The apparatus according to claim 1, wherein said high gain control input is generated in further response to an operational amplifier circuit.

4. The apparatus according to claim 3, wherein said amplifier circuit is configured to generated said high gain input in response to (i) a reference signal and (ii) said low gain input.

5. The apparatus according to claim 1, wherein said high gain control input comprises a low bandwidth input and said low gain control input comprises a high bandwidth input.

6. The apparatus according to claim 3, wherein said filter circuit comprises a very low bandwidth low pass filter.

7. The apparatus according to claim 1, wherein said PLL comprises a dual filter configured to generate said low gain control input and said high gain control input in response to a pump output.

8. The apparatus according to claim 1, wherein said high gain control input is generated in response to (i) a low bandwidth filter circuit and (ii) said low gain control input.

9. The apparatus according to claim 1, wherein said high gain control input is generated in response to a number of amplifiers and filter circuits.

10. The apparatus according to claim, 3, wherein said amplifier is configured to generate said high gain input by filtering said input signal.

11. The apparatus according to claim 4, wherein said reference signal comprises a frequency approximately at a midpoint of an operating frequency range of said PLL.

12. An apparatus for operating a voltage controlled oscillator (VCO) within a phase lock loop (PLL) comprising:

means for receiving a low gain control signal;

means for receiving a high gain control signal; and means for generating an output signal having a frequency in response to said low gain and high gain control signals, wherein (i) said low gain control signal and said high gain control signal are both active and (ii) a filter circuit is configured to clamp said low gain control signal in response to reaching a maximum operating point prior to said PLL acquiring a lock.

13. A method for operating a voltage controlled oscillator (VCO) within a phase lock loop (PLL) comprising the steps of:

(A) receiving a low gain control signal;

(B) receiving a high gain control signal; and (C) generating an output signal having a frequency in response to said low gain and high gain control signals, wherein (i) said low gain control signal and said high gain control signal are both active and (ii) a filter circuit is configured to clamp said low gain control signal in response to reaching a maximum operating point prior to said PLL acquiring a lock.

14. The method according to claim 13, wherein said method comprises:

generating said low gain control signal and said high gain control signal in response to a pump output via dual filter.

15. The method according to claim 13, wherein said method further comprises the step of:

generating said low gain and high gain control signals continuously.

16. The method according to claim 13, wherein step (C) further comprises said high gain control input after a startup condition.

17. The method according to claim 13, wherein said method comprises generating said high gain control signal in response to an operational amplifier circuit and a filter circuit.

18. The method according to claim 13, wherein said method comprises generating said high gain control signal by filtering a reference signal.

19. The apparatus according to claim 1, further comprising an amplifier having (i) a first input coupled to said low gain control input and (ii) a second input coupled to an external signal.

20. The apparatus according to claim 19, wherein said external signal comprises a frequency range reference signal.

* * * * *